United States Patent [19]
Tanahashi et al.

[11] Patent Number: 5,514,196
[45] Date of Patent: May 7, 1996

[54] AIR CLEANING APPARATUS

[75] Inventors: Takashi Tanahashi, Sagamihara; Syuji Moriya, Yamanashi; Tsuyoshi Wakabayashi; Takenobu Matsuo, both of Kofu, all of Japan

[73] Assignees: Tokyo Electron Limited, Tokyo; Tokyo Electron Tohoku Limited, Esashi, both of Japan

[21] Appl. No.: 226,853

[22] Filed: Apr. 13, 1994

Related U.S. Application Data

[63] Continuation-in-part of Ser. No. 191,603, Feb. 4, 1994, Pat. No. 5,459,943.

[30] Foreign Application Priority Data

| Feb. 4, 1993 | [JP] | Japan | 5-40408 |
| Apr. 13, 1993 | [JP] | Japan | 5-086046 |
| Apr. 30, 1993 | [JP] | Japan | 5-128293 |

[51] Int. Cl.$^6$ .................................................. B01D 46/00
[52] U.S. Cl. ................ 55/324; 55/330; 55/385.200; 55/473; 55/522; 55/523; 55/525; 96/142
[58] Field of Search .............................. 55/267, 318, 324, 55/330, 338, 343, 350.1, 385.2, 467, 473, 523, 525, 522, 527, DIG. 31; 96/134, 142

[56] References Cited

U.S. PATENT DOCUMENTS

| 2,970,671 | 2/1961 | Warner | 55/330 |
| 3,538,615 | 11/1970 | Fuhring et al. | 96/142 |
| 3,824,770 | 7/1974 | Eckstein | 55/338 |
| 4,164,901 | 8/1979 | Everett | 55/267 |
| 4,687,579 | 8/1987 | Bergman | 55/523 |
| 4,726,824 | 2/1988 | Staten | 55/385.2 |
| 4,927,438 | 5/1990 | Mears et al. | 55/385.2 |
| 5,053,064 | 10/1991 | Hama et al. | 96/134 |
| 5,122,170 | 6/1992 | Satoh et al. | 96/134 |
| 5,171,337 | 12/1992 | Pollock | 55/523 |
| 5,223,138 | 6/1993 | Zievers | 55/523 |

FOREIGN PATENT DOCUMENTS

| 53-12904 | 5/1978 | Japan | 55/385.2 |
| 59-13243 | 3/1984 | Japan | 96/142 |
| 2-126912 | 5/1990 | Japan | 55/385.2 |

*Primary Examiner*—C. Scott Bushey
*Attorney, Agent, or Firm*—Oblon, Spivak, McClelland, Maier & Neustadt

[57] ABSTRACT

An air cleaning apparatus includes an air passage chamber having a suction port, from which air is sucked, and a discharge port from which the air sucked from the suction port is discharged, an air blower, provided in the air passage chamber, for sucking the air from the suction port into the air passage chamber and discharging the sucked air from the discharge port, and a particle removing mechanism for removing particles contained in the air sucked from the suction port, the entire body of the particle removing mechanism being formed of a material which generates little impurity gas detrimental to processing in a processing space.

15 Claims, 8 Drawing Sheets

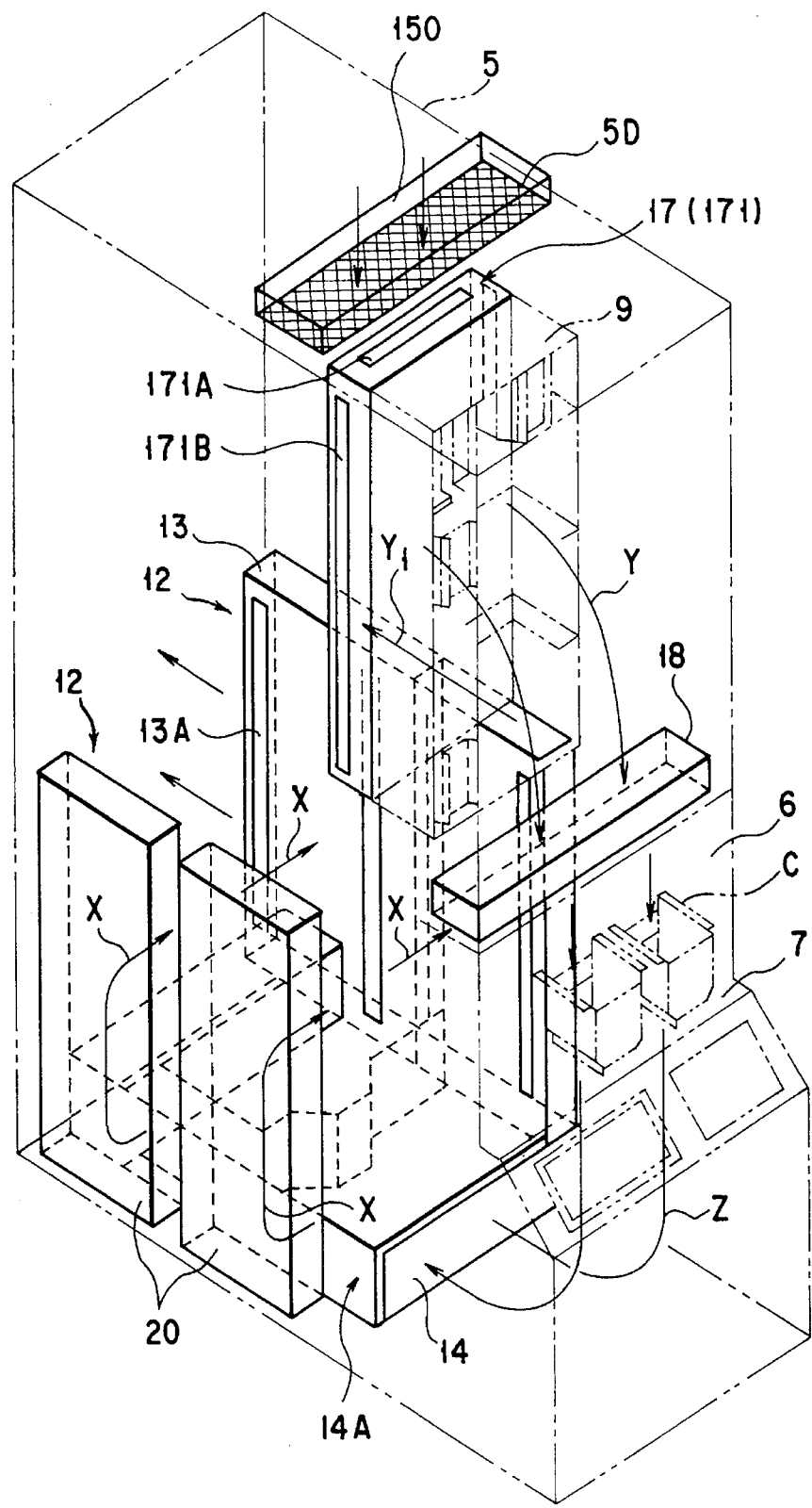
F I G. 2

AIR CLEANING APPARATUS

CROSS-REFERENCE TO THE RELATED APPLICATION

This application is a continuation-in-part of U.S. patent application Ser. No. 08/191,603, filed on Feb. 4, 1994, now U.S. Pat. No. 5,459,943.

BACKGROUND OF THE INVENTION

1. Field of the Invention

The present invention relates to an air cleaning apparatus for cleaning air of an atmosphere within and outside processing units of various processing apparatuses.

2. Description of the Related Art

In order to process an object in a desired state without adhesion of impurities, it is necessary to clean the atmosphere within and outside a processing unit in which an object is processed. For example, a film-forming apparatus such as a CVD apparatus, an oxidizing apparatus or a diffusion apparatus for forming a thin film on a surface of a semiconductor wafer in a semiconductor device manufacturing process is provided with an air cleaning apparatus for removing through a filter impurities present in an atmosphere within a processing unit in which a semiconductor wafer is transferred for processing. Thereby, adhesion of impurities on the semiconductor wafer is prevented, and a process of exactly forming a thin film on a semiconductor wafer can be performed. Such an air cleaning apparatus as applied to the CVD apparatus will now be described in detail.

A CVD apparatus, in particular a vertical CVD apparatus, comprises in general a cylindrical processing unit in which a film is formed on a semiconductor wafer, a wafer boat for holding a semiconductor wafer within the processing unit, a convey mechanism for supporting the wafer boat and inserting and taking out the wafer boat into and from the processing unit, a transfer mechanism for transferring the semiconductor wafer onto the wafer boat supported by the convey mechanism, and a housing having a space in which these components are arranged.

For example, an air blow fan and a filter for removing dust such as particles are provided within the housing, in order to prevent particles from adhering to the semiconductor which is moved within the housing by the transfer mechanism or along with the wafer boat. In this case, an air stream is formed by the air blow fan so as to flow from the rear to the front of the housing. By situating the filter along the flow of the air stream, a clean air stream is always formed within the housing, and adhesion of particles to the semiconductor wafer is prevented.

Recently, the thickness of a film layer, such as a silicon oxide film or a silicon nitride film, formed on a semiconductor has decreased more and more with an increase in diameter of the semiconductor wafer and very fine processing of the wafer. Accordingly, strict control of physical properties such as electrical characteristics of the formed layer is required, and a very slight amount of impurities in the atmosphere for processing influences the finished state of the formed layer greatly. On the other hand, in fine processing of 16 MDRAM or a higher level, fine particles, which cannot be explained from an aspect of a dust adhesion phenomenon, appear on the formed layer. Physical properties of the formed layer, such as electrical characteristics, are degraded due to those particles, resulting in a lower yield.

In order to solve this problem, the inventors studied and analyzed in detail impurities which will become a factor of degradation in physical properties such as electrical characteristics of the formed layer, and, in particular, components of a slight amount of gas in the atmosphere for processing, by means of modern analyzing technology. The inventors found that the components of such a slight amount of gas are a factor of the particle generation phenomenon. In addition, a qualitative analysis was conducted on the components of a slight amount of impurity gas contained in the air within the housing of the CVD apparatus. As a result, it was found that the air within the housing contains a small amount of gas, e.g. an organic compound such as hydrocarbon, a phosphide, a boride, etc.

The inventors further studied the source of the small amount of impurity gas. As a result, it was assumed that the source of impurity gas is the material of the dust-removing filter and a small amount of compound present in the material is liberated within the housing in the form of impurity gas. The components of the compound remaining in the filter material is compared with the components of the impurity gas specified by the aforementioned gas analysis, and it turned out that both components coincide. A high-performance air filter made of HEPA, ULPA, etc. is generally used as dust-removing filter. The air filter is fixed to the filter frame by means of an organic adhesive. The filter frame is made of a metallic material. The air filter is formed in a sheet-like shape of a mixture of $SiO_2$ as a main component and other various components such as boron oxide, etc. Specifically, the organic impurity of the adhesive for coupling the air filter and filter frame, as well as the small amount of the compound remaining in the material of the dust-removing filter, is liberated within the housing as impurity gas.

It was also found that a substance which facilitates liberation of a boron compound, etc. from the dust-removing filter flows into the CVD apparatus from the clean room. Specifically, such a small amount of impurity gas is liberated from the dust-removing filter (the liberation is sometimes facilitated by a substance flowing into the CVD apparatus from the clean room), and the impurity gas is conveyed to the processing atmosphere by the air blow fan situated within the housing. The impurity gas adheres to a film layer on the semiconductor wafer in the film forming process, and fine particles are formed on the surface of the film layer. In particular, when the wafer boat is taken out of the processing unit by the convey mechanism after the film forming process, the temperature within the housing increases considerably by radiation heat from the wafer boat. Consequently, the temperature of the dust-removing filter rises and the liberation of impurity gas from the dust-removing filter is facilitated. In addition, the film formed by the film formation process is chemically active at high temperatures. Because of these two factors, fine particles are easily formed on the surface of the formed film.

SUMMARY OF THE INVENTION

An object of the present invention is to provide an air cleaning apparatus capable of reducing as much as possible the amount of a generated impurity gas detrimental to processing of an object.

In order to achieve the object, there is provided an air cleaning apparatus comprising: an air passage chamber having a suction port, from which air is sucked, and a discharge port from which the air sucked from the suction port is discharged; air blow means, provided in said air passage chamber, for sucking the air from said suction port into the air passage chamber and discharging the sucked air from said discharge port; and particle removing means for removing particles contained in the air sucked from the suction port, the entire body of said particle removing means being formed of a material which generates little impurity gas detrimental to processing in a processing space.

For example, a metallic material, a ceramic material or a resin material may be used as a material which generates little impurity gas.

Unlike the case where a conventional filter made of $SiO_2$-based material is used, the air cleaning apparatus with the above structure generates little impurity gas. Thus, particles in the air sucked in the processing space can be removed without generating an impurity gas detrimental to the processing in the processing space.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 illustrates circulation of air in the housing of the CVD apparatus shown in FIG. 1;

DETAILED DESCRIPTION OF THE PREFERRED EMBODIMENTS

Figure 1:
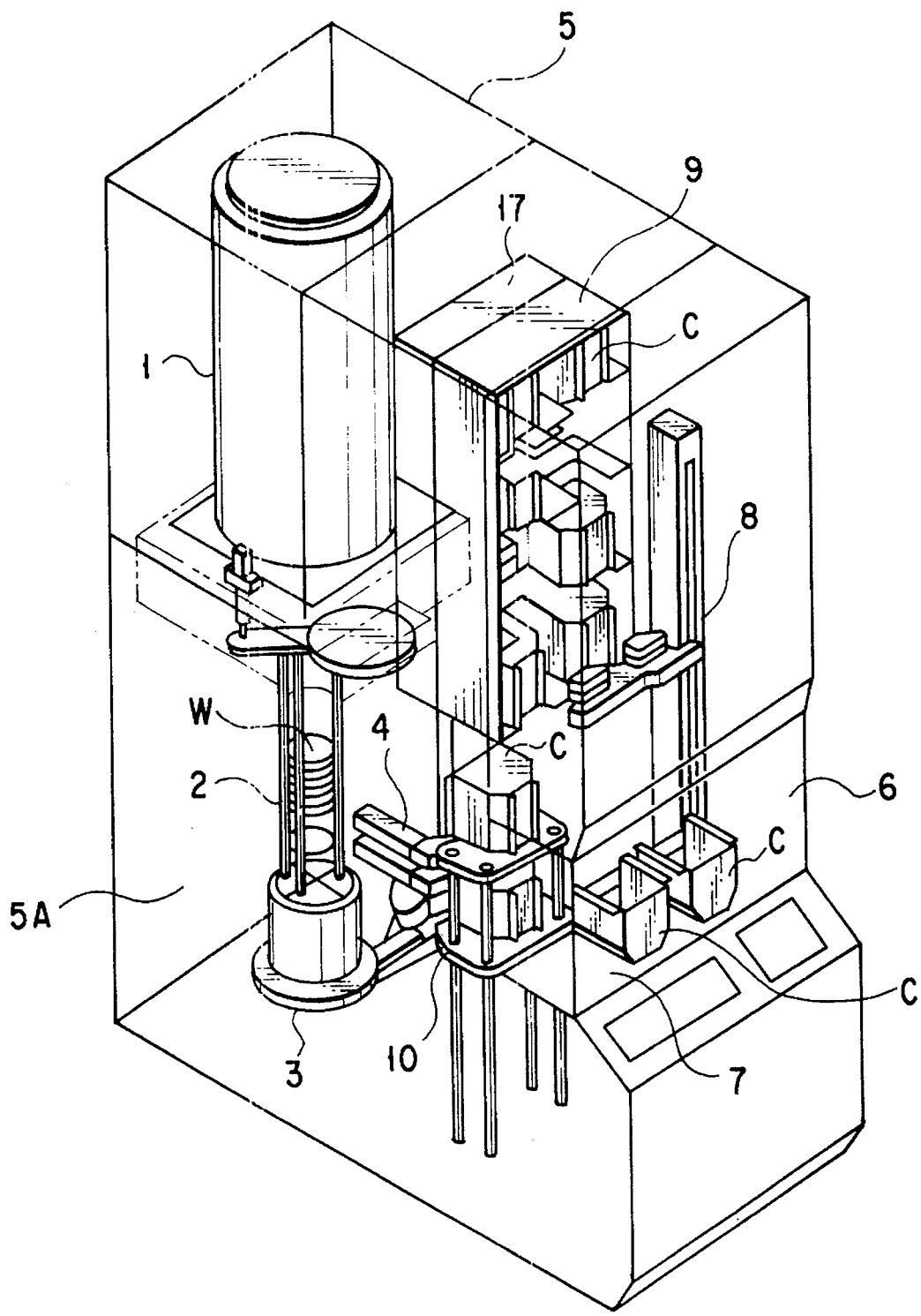
FIG. 1 is a perspective view of a CVD apparatus having a plurality of air cleaning apparatuses according to a first embodiment of the present invention.

Preferred embodiments of the present invention will now be described with reference to the accompanying drawings. FIGS. 1 to 4 show a first embodiment of the invention. FIG. 1 shows the structure of a CVD apparatus which is an example of a processing unit. The CVD apparatus comprises a cylindrical processing unit 1, for example, having an upper end portion closed and a lower end portion opened, a wafer boat 2 for horizontally holding a plurality of semiconductor wafers (objects) w arranged vertically at regular intervals within the processing unit 1, a convey mechanism 3 for inserting and taking out the wafer boat 2 into and from the processing unit 1, a transfer mechanism 4 (hereinafter referred to as "wafer transfer 4") for shifting the semiconductor wafers W between the wafer boat 2 supported by the convey mechanism 3 and a wafer cassette C capable of storing, e.g. 20 semiconductor wafers W, and a housing 5 having a space 5A in which these components are arranged. An opening 6, which is opened and closed by a door (not shown), is formed in the front face of the housing 5. The wafer cassette C, in which the semiconductor wafers W are stored, is inserted into and taken out of the housing 5 by means of a transfer robot (not shown) through the opening 6. A carrier IO port 7, at which two wafer cassettes C supporting the semiconductor wafers W vertically are mounted, is provided inside the opening 6. An air flow passage, through which air flows downwards within the housing 5 is formed in the carrier IO port 7, as will be described later. Moreover, the carrier IO port 7 is provided with a wafer alignment mechanism (not shown) and a horizontal-vertical conversion mechanism (not shown). The wafer alignment mechanism aligns the semiconductor wafers W in the wafer cassettes C in a predetermined direction, by making use of orientation flats of the wafers w. The horizontal-vertical conversion mechanism rotates the wafer cassette C by 90° to change the horizontal position of the semi-conductor wafer W to the vertical position thereof and vice versa. Accordingly, after the semiconductor wafers W in the wafer cassette C are aligned in a predetermined direction by the wafer alignment mechanism, the wafers W are arranged horizontally by the horizontal-vertical conversion mechanism.

A carrier transfer 8 is provided inside the carrier I/O port 7. The wafer cassette C is transferred to a carrier stage 9 located inwards by the carrier transfer 8. The carrier stage 9 can store, e.g. eight wafer cassettes C vertically and horizontally. The carrier stage 9 is designed to store the wafer cassettes C containing semiconductor wafers W which have been or will be processed in the processing unit 1.

A transfer stage 10 is situated below the carrier stage 9. The wafer cassette C is transferred between the transfer stage 10 and carrier stage 9 by the carrier transfer 8. Moreover, the semiconductor wafers W are transferred by the wafer transfer 4 between the wafer cassette C mounted on the transfer stage 10 and the wafer boat 2 supported by the convey mechanism 3. Specifically, the wafer transfer 4 takes out non-processed semiconductor wafers W one by one from the wafer cassette C on the transfer stage 10 and transfers the wafers W onto the wafer boat 2, and takes out the processed semiconductor wafers W one by one from the wafer boat 2 and transfers the wafers W into the cassette C on the transfer stage 10.

Figure 3:
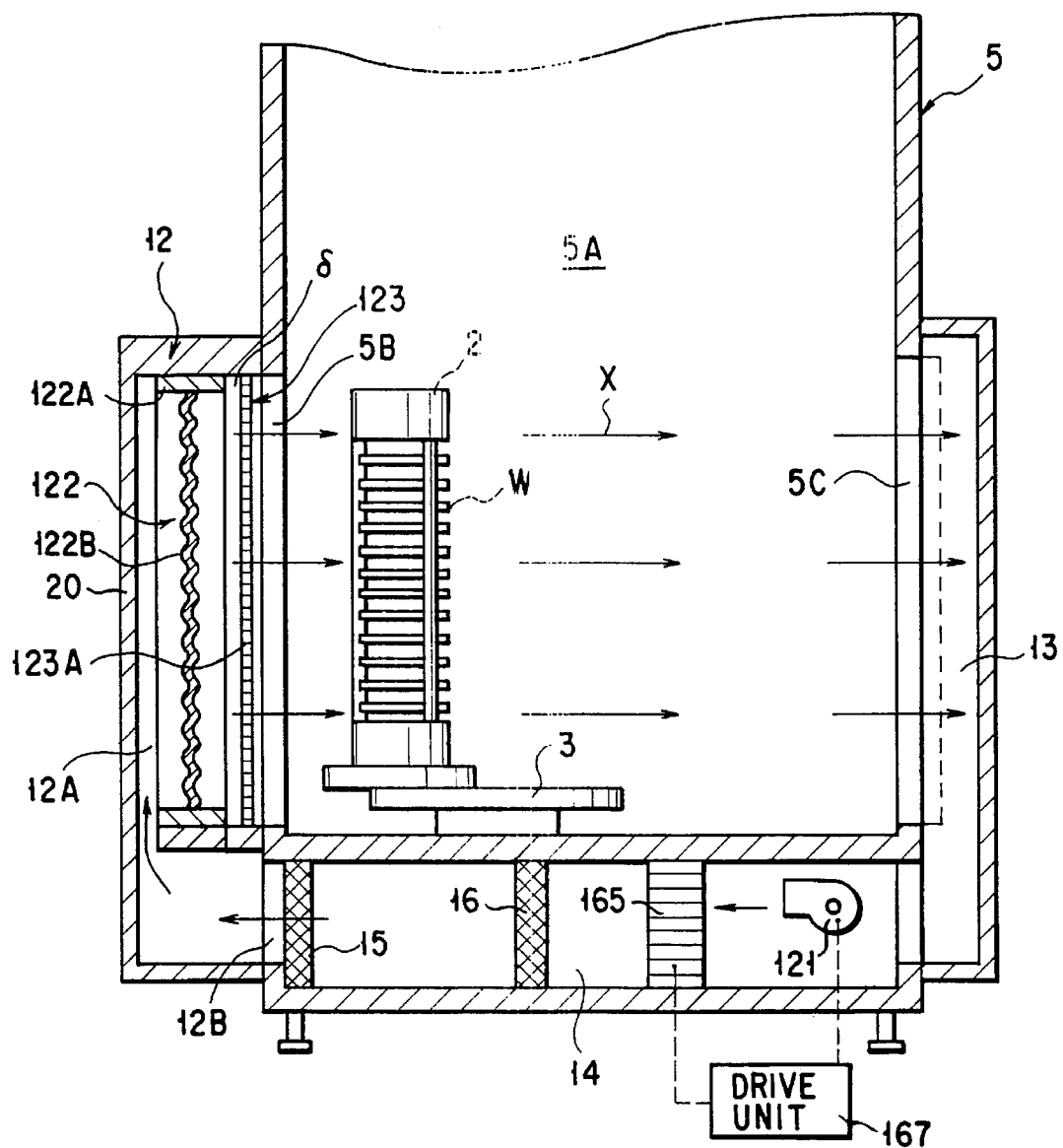
FIG. 3 is a cross-sectional view showing schematically the peripheral region of a processing unit of the CVD apparatus shown in FIG. 1.

As is shown in FIGS. 2 and 3, the CVD apparatus comprises a first air cleaning device 12 having a discharge port 5B and a suction port 5C formed in both side faces of the housing 5. The first air cleaning device 12 has two air cleaners 20 each serving also as a single door for maintenance. Each air cleaner 20 is provided on one side of a space 5A in the housing 5, and more specifically at the side opening (discharge port) 5B on the left side of the housing 5. The first air cleaning device 12 has an air passage chamber formed by an inner space of the air cleaner 20, a side duct 13 communicating with the right-side opening (suction port) 5C of the housing 5 and a bottom duct 14 provided at the bottom of the space 5A and communicating with the side duct 13. As is shown in FIG. 3, a first air blower 121 for sucking air from the suction port 5C and feeding the air is provided at the bottom duct 14 near the suction port 5C. Each of the air cleaners 20 comprises a container constituting a door; an opening 12B communicating with the container and the bottom duct 14; a first dust-removing filter 122, situated in the container, for removing particles contained in the air which is passed through a duct portion 12A by the first air blower 121; and a pressure-averaging plate 123 situated inside the first dust-removing filter 122 in parallel to the filter 122 with a gap $\delta$ and having a number of pores 123A for uniformly feeding out dust-free air from the entire surface towards the side duct 13 provided in the right-side opening 5C.

The first dust-removing filter 122 comprises a rectangular filter frame 122A and an air filter portion 122B having a peripheral edge fixed to the filter frame 122A by means of soldering. It is important that the entire structure of the first dust-removing filter 122 comprising the filter frame 122A and air filter portion 122B is made of a metallic material (e.g. the filter frame 122A is made of aluminum and the air filter portion 122B is made of stainless steel), a ceramic material or a resin, and that the air filter portion 122B is fixed to the filter frame 122A by using a low gas generating substance. In other words, unlike the prior art, the first dust-removing filter 122 is not made of a $SiO_2$-based material which liberates a great amount of impurity gas, but it is made of a metallic material, ceramic material or resin material which liberates less impurity gas. In addition, an adhesive, which emits organic gas after drying, is not used for bonding the filter frame 122A and air filter portion 122B. The air filter portion 122B is formed in a flat plate shape or in a corrugated shape or cylindrical shape to increase the surface area. Of course, the shape of the air filter portion 122B is not limited to this, only if the properties of the material used are the same as those of the aforementioned materials (metallic material, ceramic material or resin). For example, in the case of forming the air filter portion 122B of a metallic material, micron-order metallic fibers may be compressed into a sheet about 1 mm thick and sintered.

As is shown in FIG. 2, a slit 13A (suction port) through which air from the air cleaners 20 passes is formed in the inside face of the side duct 13. The side duct 13 and air cleaners 20 are connected by the bottom duct 14 situated below the space 5A. An air circulation passage is formed by the bottom duct 14, the duct portion 12A of the air cleaners 20 and the side duct 13. Accordingly, the air fed into the space 5A in the housing 5 from the air cleaners 20 is circulated in the space 5A via the side duct 13, bottom duct 14 and duct portion 12A, thereby forming a horizontal circulation flow X in the space 5A. Particles present in the air of the circulation flow X are repeatedly removed by the first dust-removing filter 122. Thus, the circulation flow X of cleaned air is always formed in the housing 5.

A slit (not shown) is formed in the outer face of the side duct 13, and part of the circulated air is discharged from this slit. On the other hand, an air inlet 5D formed by a mesh-like metallic material is provided at a top portion of the housing 5. Through the air inlet 5D, air of that amount corresponding to the discharged air is replenished from a clean room (not shown) in which the CVD apparatus is situated and the air of the circulation flow X is replenished. Thus, the pressure in the housing 5 is kept at a constant level. Specifically, the CVD apparatus is constructed such that the circulation flow X in the housing 5 is formed mainly of the air inside the housing 5 and part of the circulation flow X is replaced with outside air via the air inlet 5D and the slit of side duct 13. The bottom duct 14 houses a controller for driving the convey mechanism 3, wafer transfer 4, etc. and wiring members.

A first activated carbon filter 15 and a second activated carbon filter 16 are arranged in the bottom duct 14. A radiator 165 for cooling circulated air is situated on the upstream suction side of the first and second activated carbon filters 15 and 16. The radiator 165 is driven and controlled by a drive unit 167 to cool the air of the circulation stream X passing through the radiator 165 to a predetermined temperature. Moreover, the aforementioned first air blower 121 is situated on the upstream suction side of the radiator 165. The activated carbon filters 15 and 16 adsorb a very small amount of impurity gas generated from the first dust-removing filter 122 and dust-removing filters 174 of second and third air cleaning devices 17 and 18 (described later), impurity gas generated from mechanisms inside the CVD apparatus, impurity gas flowing into the CVD apparatus from the clean room in which the CVD apparatus is situated, or gas resulting from a generated gas in the film forming process. Thereby, such impurity gases are prevented from mixing in the circulation stream X in the space 5A of the housing 5.

As has been described above, since the first dust-removing filter 122 of the first air cleaning device 12 is made of a metallic, ceramic or resin material, the amount of impurity gas generated from the filter 122 is much less than that of impurity gas generated from the conventional filter made of $SiO_2$-based material. In addition, since no organic adhesive is used, contamination due to organic impurity in the apparatus can be prevented. Moreover, the first air cleaning device 12 can supply clean air into the space 5A, since the activated carbon filters 15 and 16 absorb positively the impurity gas generated from mechanisms, etc. in the CVD apparatus. Specifically, in the first air cleaning device 12, the air in the space 5A is sucked from the suction port 5C by means of the first air blower 121 provided in the bottom duct 14. When the sucked air is returned to the space 5A, the air heated by the radiation heat from the wafer boat 2 in the space 5A is first cooled by the radiator 165, then a small amount of impurity gas in the cooled air is adsorbed by the activated carbon filters 15 and 16 provided in the bottom duct 14, and particles (including particles liberated from the activated carbon filters 15 and 16) present in the air discharged to the duct portion 12A are removed by the first dust-removing filter 122. Thus, the purified air is fed to the space 5A to form the circulation stream X. In this case, since the first dust-removing filter 122 hardly liberates impurity gas, little impurity gas is included the circulation stream x which has passed through the first dust-removing filter 122 via the activated carbon filters 15 and 16.

Besides, in the first air cleaning device 12, by virtue of the radiator 165, the activated carbon filters 15 and 16 and dust-removing filter 122 are prevented from coming in contact with high-temperature air. Thus, the life of the activated carbon filters 15 and 16 can be increased and the generation of the impurity gas from the dust-removing filter 122 is not facilitated by heat. Since the activated carbon filters 15 and 16 are situated in the bottom duct 14 and the dust-removing filter 122 is situated in the container of the air cleaner 20, these filters 15, 16 and 122 do not directly receive heat radiated from the wafer boat 2. The radiator 165 may be situated, e.g. at the suction port 5C which directly receives radiation heat from the wafer boat 2.

Since the first air cleaning device 12 is provided with the two activated carbon filters 15 and 16 successively arranged on the upstream side of the first dust-removing filter 122, it is possible to increase the time during which the impurity gas in the air of the circulation stream X is in contact with the activated carbon filters 15, 16, and the removal of the impurity gas by the activated carbon filters 15, 16 can be ensured.

Each of the activated carbon filters 15 and 16 and each of activated carbon filters 172 and 173 of second and third air cleaning devices 17 and 18, which will be described later, is made of, e.g. activated-carbon-particle fibers in the form of a mat with high air permeability or a sheet with many fine pores. These filters function as so-called "pre-filters."

Figure 4:
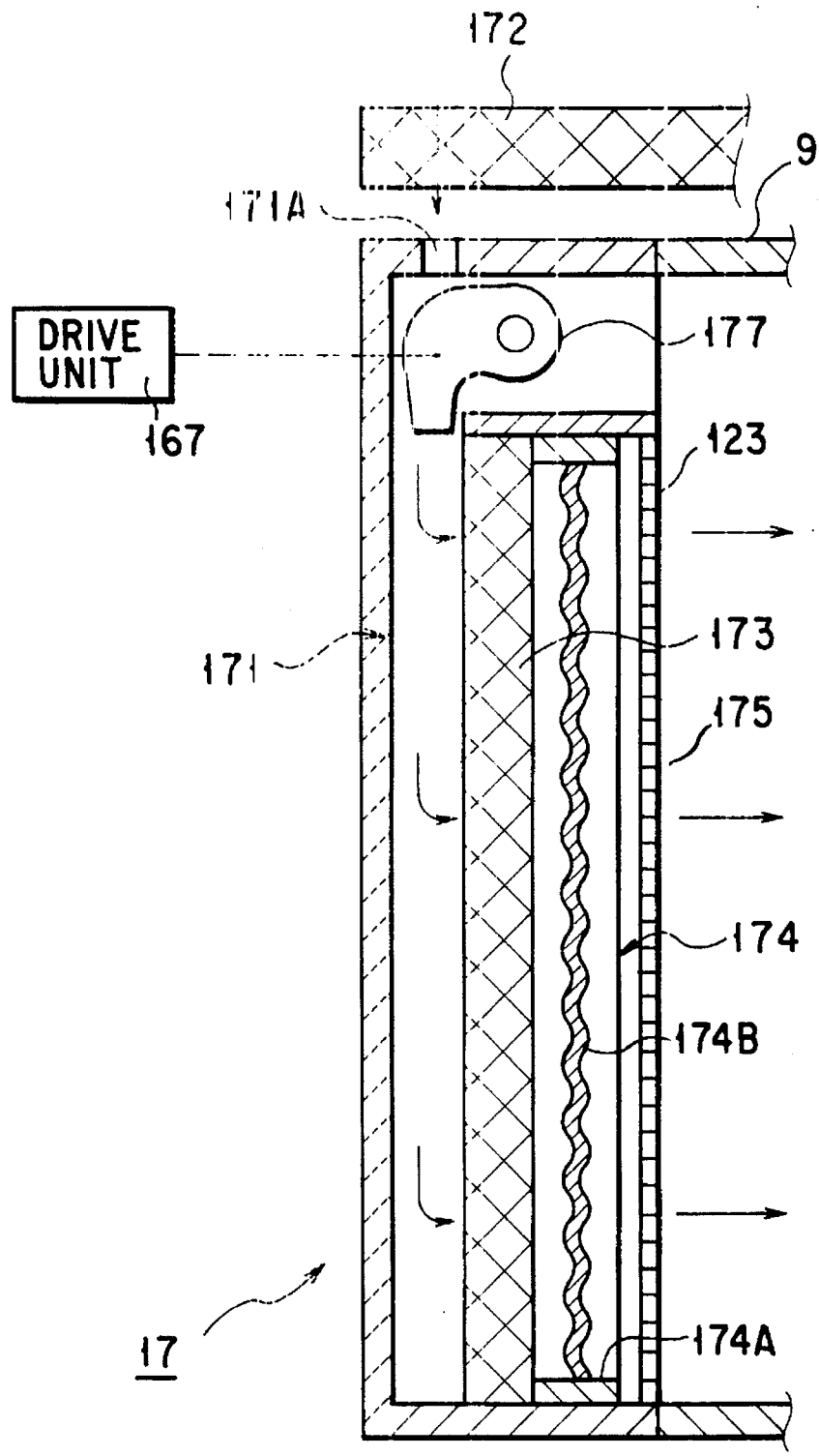
FIG. 4 is a cross-sectional view of an air cleaning apparatus arranged above the CVD apparatus shown in FIG. 1.

On the other hand, a second air cleaning device 17 for preventing impurity gas and particles present in the clean room from entering the housing 5 is provided on the upper part of the housing 5. As is shown in FIG. 1, the second air cleaning device 17 is provided along the rear face of the carrier stage 9 and below the air inlet 5D. A third activated carbon filter 172 is provided immediately above the air inlet 5D. As is shown in FIG. 4, the second air cleaning device 17 comprises a container (air passage chamber) 171 having a slit (suction port) 171A facing the air inlet 5D of the housing 5; a second air blower 177 for taking in a small amount of air from the air inlet 5D and slit 171A of container 171 and blowing the air to a discharge port 175 opening towards the carrier stage 9; a fourth activated carbon filter 173, provided on the upstream side of the discharge port 175, for adsorbing and removing a small amount of impurity gas in the air fed by the second air blower 177; a second dust-removing filter 174 for removing particles from the air which has passed through the fourth activated carbon filter 173; and a pressure-averaging plate 123 with many pores 123A for uniformly feeding the air which has passed through the second dust-removing filter 174. The second air cleaning device 17 feeds the air, from which a small amount of impurity gas and particles have been removed, to the semiconductor wafers W stored on the carrier stage 9, as shown in FIGS. 2 and 4 and forms an air stream Y. In the case of this structure, too, the second dust-removing filter 174 comprises a rectangular filter frame 174A and an air filter portion 174B having a peripheral edge fixed to the filter frame 174A by means of soldering. The entire structure of the second dust-removing filter 174 comprising the filter frame 174A and air filter portion 174B is made of a metallic material, a ceramic material or a resin, and the air filter portion 174B is fixed to the filter frame 174A by means of soldering.

An air stream Y1 which is reflected by the front wall of the housing 5 is sucked in the container 171 by the second air blower 177 through slits 171B formed on both side faces of the container 171. Thereby, impurity gas in the air stream Y1 is adsorbed and removed by the fourth activated carbon filter 173. The second air blower 177 is driven and controlled by a drive unit 167.

Since the second dust-removing filter 174 of the second air cleaning device 17 is entirely made of a metallic, ceramic or resin material, the amount of impurity gas generated from the filter 174 is much less than that of impurity gas generated from the conventional filter made of $SiO_2$-based material. In addition, the second air cleaning device 17 can supply clean air into the CVD apparatus, since the activated carbon filters 172 and 173 absorb positively the impurity gas flowing in from the clean room. In particular, since the two activated carbon filters 172 and 173 are successively arranged, it is possible to increase the time during which the impurity gas is in contact with the activated carbon filters 172, 173, and the removal of the impurity gas by the activated carbon filters 172, 173 can be ensured.

A third air cleaning device 18 is provided above the carrier IO port 7 on the downstream side of the air stream Y. The third air cleaning device 18 takes in most of the air stream Y and forms a downward air stream Z. The third air cleaning device 18 comprises a third air blower, a fifth activated carbon filter and a third dust-removing filter situated on the downstream side of the fifth activated carbon filter (these components are not shown), and the structures of these components are the same as those of the components of the second air cleaning device 17. The third air cleaning device 18 removes impurity gas and particles present in the downward air stream Z, feeds purified air from an opening portion 14A to the bottom duct 14 via the carrier IO port 7 and joins the purified air to the air returned from the side duct 13. The impurity gas contained in the downward stream Z which has passed through the third air cleaning device 18 is adsorbed and removed by the activated carbon filters 15 and 16 of the bottom duct 14.

The operation of the CVD apparatus having the air cleaning apparatus with the above structure will now be described.

When the semiconductor wafers W of, e.g. 8 inches are subjected to film forming processing by means of the CVD apparatus, the processing unit 1 is heated to a predetermined temperature in accordance with the processing performed on the wafers W and the first to third air cleaning devices 12, 17 and 18 are driven. Circulation streams X, Y and Z indicated by arrows in FIG. 2 are formed in the housing 5 by the air cleaning devices 12, 17 and 18. Thereafter, two wafer cassettes C storing the semiconductor wafers W are mounted on a predetermined position of the carrier IO port 7 by the transfer robot. The wafers W in the wafer cassettes C mounted in the carrier IO port 7 are aligned in a predetermined direction by the wafer alignment mechanism and are set in the horizontal state by horizontal-vertical conversion mechanism. In this state, the wafer cassettes C are transferred to the carrier stage 9 by the carrier transfer 8. This operation is repeated several times and a predetermined number of wafer cassettes C are placed on the carrier stage 9. Then, the door (not shown) of the opening 5 is closed.

Thereafter, the wafer cassettes C in the carrier stage 9 are transferred to the transfer stage 10 by the carrier transfer 8, and the semiconductor wafers W in the wafer cassettes C on the transfer stage 10 are successively transferred onto the wafer boat 2 by the wafer transfer 4. If a predetermined number of semiconductor wafers W have been transferred onto the wafer boat 2, the convey mechanism 3 is driven and the wafer boat 2 is conveyed into the processing unit 1. The semiconductor wafers W are processed for a predetermined time period in a specified atmosphere having a predetermined temperature. If the processing of the semiconductor wafers w is completed, the wafers W are conveyed from the processing unit 1 in an order reverse to the order mentioned above.

When the first air cleaning device 12 is driven at the time of processing the semiconductor wafers W, the circulation stream X is formed by the first air cleaning device 12 within the housing 5 of the CVD apparatus. Thereby, purified air is always circulated in the housing 5, and a small amount of particles or impurity gas is prevented from adhering to the wafers w. Specifically, when the first air blower 121 is driven and air is sucked in the bottom duct 14 of the housing 5 by the first air blower 121, the air passes through the activated carbon filters 15 and 16 and flows into the duct portion 12A in the air cleaners 20. At this time, the small amount of impurity gas in the air sucked in the duct portion 12A from the bottom duct 14 is adsorbed and removed by the activated carbon filters 15 and 16. While the air which has entered the air cleaners 20 is passing through the first dust-removing filter 122, the small amount of particles is removed by the first dust-removing filter 122. The air purified by the activated carbon filters 15 and 16 and first dust-removing filter 122 is uniformly fed into the entire space 5A via the pressure-averaging plate 123 located on the downstream side of the first dust-removing filter 122, and sent to the side duct 13 via the slit 13A. Most of the air which has entered the side duct 13 is sucked in the bottom duct 14 via the lower part of the side duct 13, and it forms the circulation stream X in the space 5A.

Since the circulation stream X of the clean air, from which the impurity gas and particles have been removed, is formed within the space 5A, the impurity or particles are prevented from adhering to the semiconductor wafers W which move within the space 5A.

On the other hand, part of the air forming the circulation stream X is exhausted at the side duct 13. The air of that amount corresponding to the air exhausted from the side duct 13 is replenished from the clean room by the second air cleaning device 17. Specifically, if the second air blower 172 is driven, air is taken in from the clean room through the air inlet 5D of the housing 5 and the slit 171A of the container 171. The air taken in from the clean room is fed towards the carrier stage 9 by the second air blower 172 and the air forms the air stream Y flowing towards the front face of the housing 5. Part of the air stream Y is returned from the front face of the housing 5 as air stream Y1 and taken into the container 171 through the slit 171B once again, and the air joins the air from the clean room. However, most of the air stream Y is guided downwards by the suction function of the third air cleaning device 18, and forms the downward air stream Z. While the downward air stream Z is passing through the third air cleaning device 18, a small amount of impurity gas and particles remaining in the downward air stream Z are removed by the fifth activated carbon filter and third dust-removing filter. Thereafter, the purified downward air stream Z is fed into the bottom duct 14 and joins the clean air circulation stream Z circulating to the bottom duct 14 from the side duct 13. The opposite-directional clean air streams (downward stream Z and circulation stream X), which join in the bottom duct 14, flow through the activated carbon films 15 and 16 and are rid of dust in the air cleaners 20, thus forming a one-directional purified air circulation stream X.

As has been described above, in the air cleaning apparatus of the present invention, the air stream consisting mainly of the circulation stream X is formed in the space 5A of the housing 5. By this air stream, the air in the housing 5 is always circulated and the particles or impurity gas in the air is removed. Specifically, the particles in the air are removed by the dust-removing filters 122 and 174 provided in the first to third air cleaning devices 12, 17 and 18, and the impurity gas and a gas due to film forming processing present in the housing 5 are removed by the activated carbon filters 15, 16,172 and 173. Accordingly, a small amount of impurity gas or particles, which may cause damage to the semiconductor wafers W, are prevented from adhering to the wafers W present in the housing 5. Thereby, degradation in electrical characteristics of the surfaces of the semiconductor wafers and the surfaces of the formed films can be prevented, and the yield is improved.

The most important point in the air cleaning apparatus of the present embodiment is that the entire dust-removing filter of the air cleaner is made of a metallic, ceramic, or resin material. Accordingly, the dust-removing filters 122 and 174 of the present embodiment generate a much less amount of impurity gas than the conventional filters made of $SiO_2$ material. In addition, in the air cleaning apparatus of the present embodiment, the impurity gas in the processing space generated by the mechanisms, etc. provided within the CVD apparatus is positively adsorbed by the activated carbon filters 15, 16,172 and 173. Thus, the purified air can be supplied into the space 5A, and the impurity gas is prevented from adhering to the film which is formed by the processing and is chemically active at high temperatures. Thereby, a chemical reaction between the impurity gas and formed film is prevented, a particle generation phenomenon is prevented, and degradation in electrical characteristics, etc. of the formed film can be prevented.

In the above embodiment, the air in the space 5A is sucked in the bottom duct 14 to form the circulation stream X. However, all air in the space 5A may be discharged from the side duct 13 without circulation.

Figure 5:
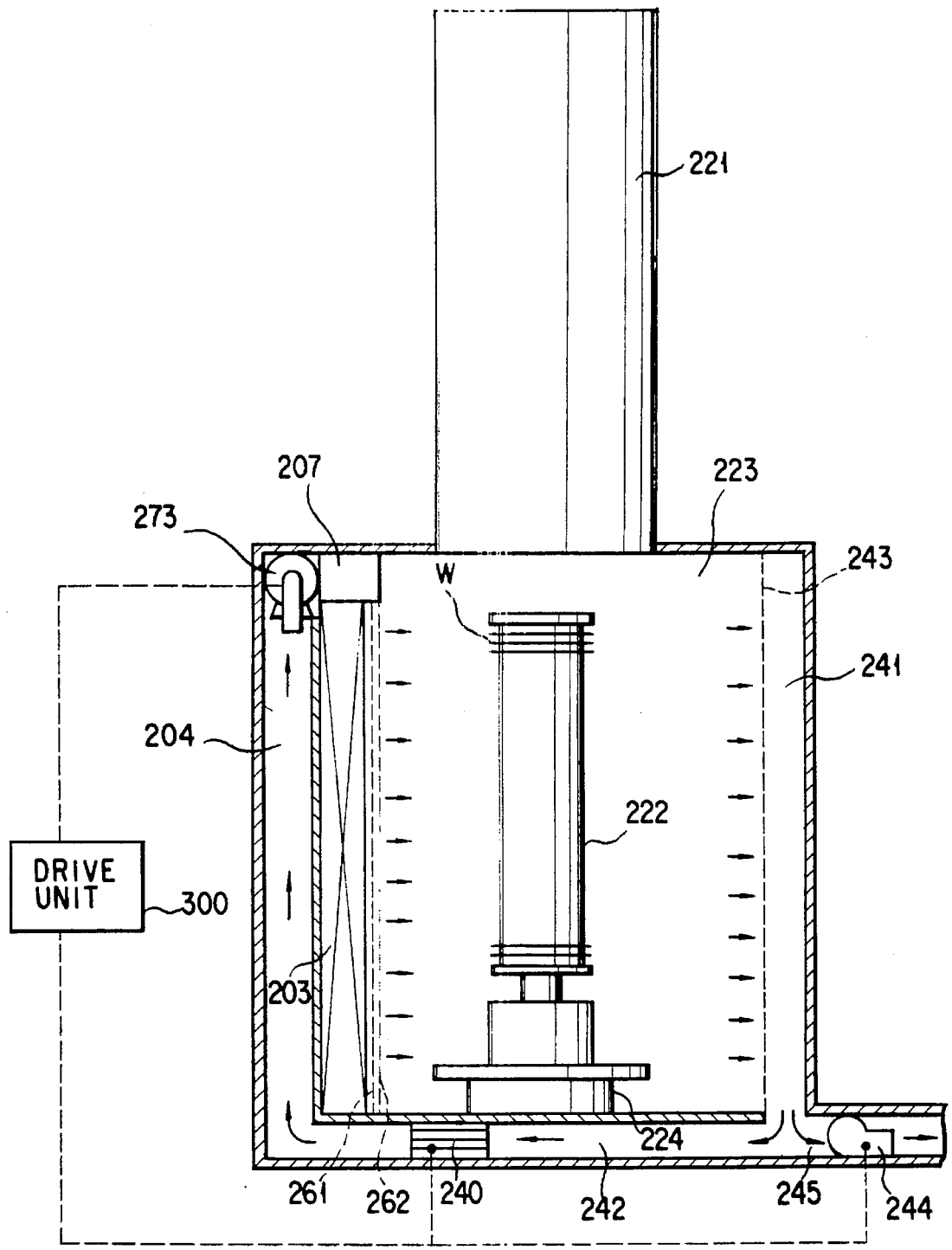
FIG. 5 is a cross-sectional view showing a main part of a CVD apparatus having an air cleaning apparatus according to a second embodiment of the present invention.

A second embodiment of the present invention will now be described. FIG. 5 is a cross-sectional view showing a main part of a vertical heat-processing apparatus having an air cleaning apparatus of the second embodiment. In FIG. 5, numeral 221 denotes a vertical heat-processing furnace. A transfer chamber 223 is situated below the heat-processing furnace 221. The transfer chamber 223 transfers wafers W between a wafer boat 222 and a wafer carrier (not shown). The wafer boat 222 is introduced into the heat-processing furnace 221 by a boat elevator 224 in the state in which a number of wafers W are vertically shelved in the wafer boat 222.

The air cleaning apparatus of the present invention has a filter unit 203 provided on the side wall of the transfer chamber 223. An air flow chamber 204 is formed on the rear side of the filter unit 203, and an air flow chamber 241 is formed on that side wall of the transfer chamber 223, which faces the filter unit 203. The air flow chambers 204 and 241 communicate with each other via an air passage 242 formed below the bottom of the transfer chamber 223. The air flow chambers 204 and 241 and air passage 242 constitute an air passage chamber of the air cleaning apparatus of the present embodiment. The air heated in the transfer chamber 223 is cooled by cooling means such as water-cooling radiator 240 provided in the air passage 242, before the heated air is fed into the filter unit 203.

Figure 6:
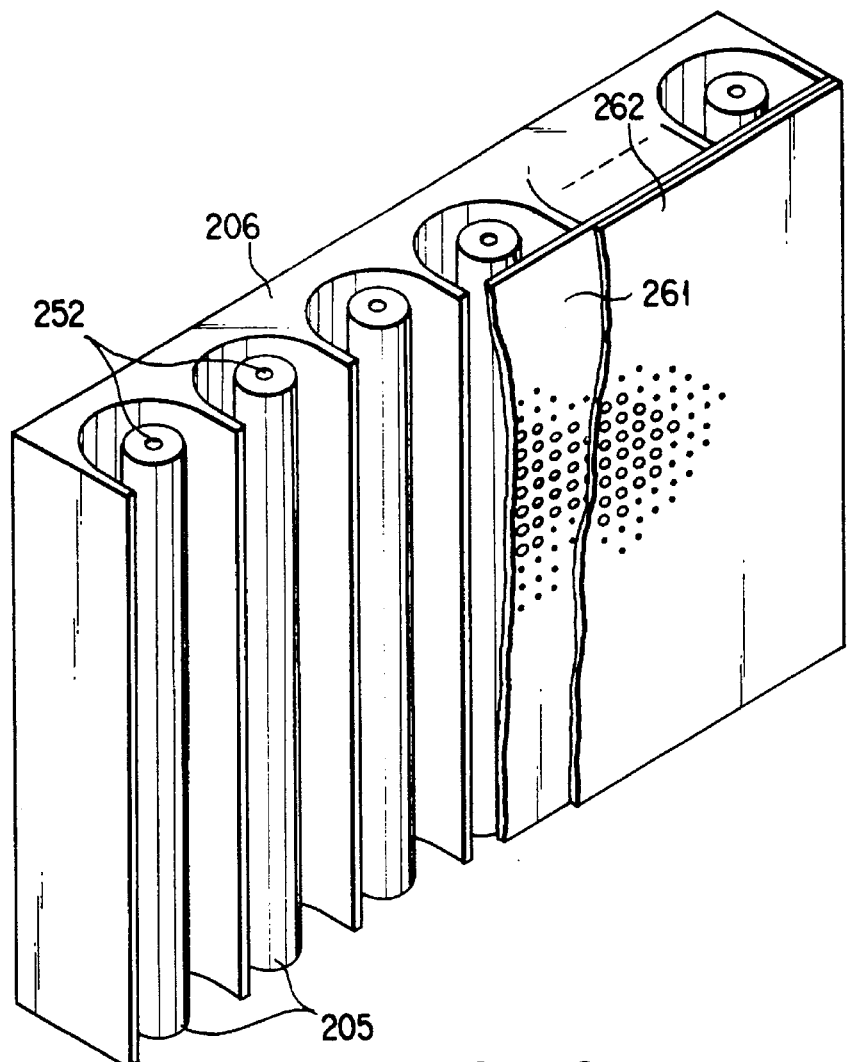
FIG. 6 is a perspective view of a filter unit of the air cleaning apparatus shown in FIG. 5.
Figure 7:
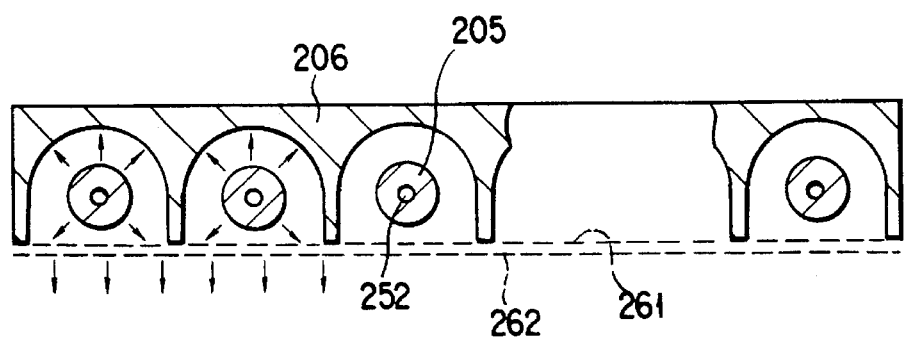
FIG. 7 is a transverse sectional view of the filter unit shown in FIG. 6.
Figure 8:
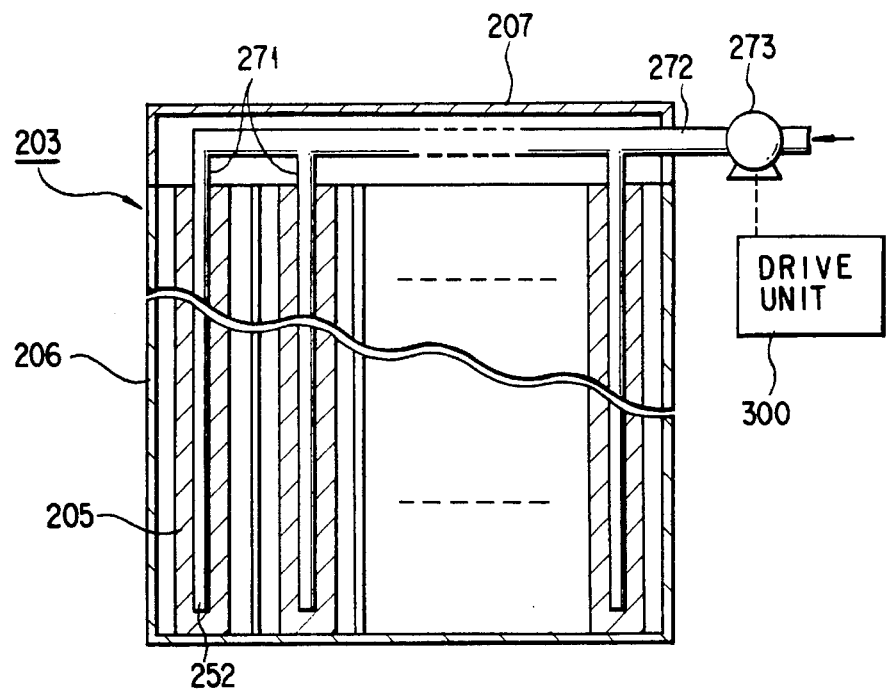
FIG. 8 is a vertical sectional view of the filter unit shown in FIG. 6.

As is shown in FIGS. 6 to 8, the filter unit 203 extends vertically from the vicinity of the top portion of the transfer chamber 223 to the bottom thereof. The filter unit 203 comprises a plurality of cylindrical filters 205 arranged in parallel, air-stream restriction panel 206 situated in rear of the cylindrical filters 205, and two air-stream restriction plates 261 and 262 laminated in front of the cylindrical filters 205.

Each of the cylindrical filters 205 is made of, e.g. a porous sintered metallic, ceramic or resin material, with an outside diameter of, e.g. 30 mm. An air feed hole 252 is formed in a center portion of the cylindrical filter 205 over the entire length thereof. The air feed hole 252 extends axially in the cylindrical filter 205, with one end opened at the top portion of the filter 205 and the other end closed in the vicinity of the lower end of the filter 205. The air feed hole 252 has a diameter of, e.g. about 10 mm. In addition, a bottom portion of the cylindrical filter 205 is fixed to the bottom of the transfer chamber 223 by fixing means (not shown).

The air-stream restriction panel 206 surrounds both lateral sides and the rear side of each cylindrical filter 205 with a gap. The restriction panel 206 is formed of, e.g. a metallic sheet so as to define divided regions for the respective cylindrical filters 205. The restriction panel 206 prevents a gas discharged from the outer peripheral surface of each cylindrical filter 205 from flowing towards the lateral sides and rear side, and guides the gas to the front side, i.e. the transfer region. The air-stream restriction plates 261 and 262 function to form as parallel as possible streams with low disturbance emitted from the divided regions defined by the air-stream restriction panel 206. For example, the air-stream restriction plates 261 and 262 are made of, e.g. a punched metallic plate having many punched small holes (discharge ports), a metallic net with small meshes, or a slit plate with many slits (discharge ports).

A manifold 207 having the same number of branch pipes 271 as the cylindrical filters 205 is attached to a top portion of the filter unit 203. An outlet end portion of each branch pipe 271 is connected to an opening end of the air feed hole 252 at the top end of the cylindrical filter 205, for example, by means of a coupling member (not shown). A common input end 272 of the branch pipes 271 is connected to a pressure-feed means, e.g. a pump 273 provided at an upper part of the air flow chamber 204. The upper end portion of the filter unit 203 is closed by the lower surface of the manifold 207, so that the air blown out of each cylindrical filter 205 may not leak from the upper end portion of the filter unit 203.

A non-uniform flow preventing plate 243 made of, e.g., a punched metallic plate having many punched small holes (suction ports) or a slit plate with many slits (suction ports) is situated on that side of the air flow chamber 241 which faces the filter unit 203. In order to exhaust part of the air which has flowed into the air flow chamber 241 from the filter unit 203, a branch air passage 245 having a blower 244 is formed to communicate with the air flow chamber 241. The radiator 240, blower 244 and pump 273 are driven and controlled by a drive unit 300.

The operation of the air cleaning apparatus having the above structure will now be described. In the transfer chamber 223, a predetermined number of wafers W are transferred from the wafer carrier (not shown) to the wafer boat 222 by the transfer robot (not shown). Then, the wafer boat 222 is raised by the boat elevator 224 and introduced into the heat-processing furnace 221. After the heat processing, the wafer boat 222 is lowered by the boat elevator 224 and drawn out of the heat-processing furnace 221. The heat-processed wafers W are transferred from the wafer boat 222 to the wafer carrier by the transfer robot.

On the other hand, the pump 273 is driven and the air in the air flow chamber 204 is fed into the air feed hole of each cylindrical filter 205 via the branch pipe 271 of the manifold 207 with a pressure of, e.g. 2 Kgf/cm$^2$ which is double the atmospheric pressure. Then, the air is emitted from the outer periphery of the cylindrical filter 205, and the air is guided into the transfer chamber 223 as laminar air flows at a flow rate of, e.g. 0.1–0.3 m/s. Part of the air is guided into the transfer chamber 223 directly via the double air-stream restriction plates 261 and 262, and other part of the air is once emitted to the lateral sides or rear side and then reflected by the surface of the air-stream restriction panel 206 and guided into the transfer chamber 223 via the air-stream restriction plates 261 and 262.

When the pump 273 and blower 244 are driven, the pressure within the air flow chamber 241 is reduced by the suction functions thereof. Accordingly, the laminar air flows which have entered the transfer chamber 223 are sucked into the air flow chamber 241 via the non-uniform flow preventing plate 243. Part of the air sucked in the air flow chamber 241 is cooled by the radiator 240 via the air passage 242 and sucked into the pump 273 via the air flow chamber 204. The other part of the air sucked in the chamber 241 is exhausted to the outside via the branch air passage 245 by the blower 244.

In the present embodiment, the entire cylindrical filters 205 of the filter unit 203 of the air cleaning apparatus are formed of a metallic, ceramic or resin material, and the air-stream restriction plates 261 and 262 of the filter unit 203 are made of a metallic material, etc. Thus, as compared to the case where the conventional filter of SiO$_2$-based material is used, the amount of generated impurity gas is very little. In particular, the present embodiment has the following advantage. For example, in the case where the metallic sheet-like member is used as a filter as in the first embodiment in order to obtain high cleaning effects, the air resistance of the filter is considerably high (the loss of air pressure in the filter is high) and accordingly a high pressure on the input side of the filter must be maintained. As a result, the air blowing device requires a large-scale construction. In the second embodiment, however, the axially extending air feed hole 252 is formed in each cylindrical filter 205 and pressurized air is fed into the hole 252. Thus, the input-side pressure of the cylindrical filter 205 can be easily increased up to, e.g. double the atmospheric pressure without employing an air blower including, e.g. large-scale compressor. Accordingly, the cylindrical filter 205 may be made of a high gas-pressure filtering material such as metals or ceramics which liberates little impurities such as boron, and therefore a clean gas free from chemical contaminants can be obtained while maintaining a high degree of freedom of choice of material for the cylindrical filter 205. In addition, in the present embodiment, since the gas emitted from the cylindrical filters 205 is output from the air-stream restriction plates 261 and 262 as laminar flows, adhesion of particles to the objects to be processed can surely be prevented.

A very high cost is incurred in forming, e.g. a metallic plate of the filter in a corrugated shape, as in the first embodiment, in order to increase the surface area of the filter. The cylindrical filter of the second embodiment is very easy to form, in particular, a resin material is used, and the surface area thereof is large. The cylindrical filter is very advantageous in terms of costs and filtering efficiencies. With respect to the filtering efficiency, the pressurized air fed into the center area of the cylindrical filter 205 flows in the radial direction out of the peripheral surface of the filter 205. Thus, the filtering capacity per unit flow amount is high and therefore even if the input-side pressure is low, a high filtering efficiency is obtained. In particular, in the case of removing fine particles, this technique is advantageous since it is better to decrease the speed of air passing through the filter. Moreover, since the air flowing out of the cylindrical filter 205 is passed through the air-stream restriction plates 261 and 262 and guided into the transfer region as laminar flows, adhesion of particles to the wafers W can surely be prevented.

In the second embodiment, like the first embodiment, an activated carbon filter may be provided as impurity gas removing filter in the air passage, thereby to surely adsorb and remove an impurity gas generated from mechanisms in the processing unit.

Figure 9:
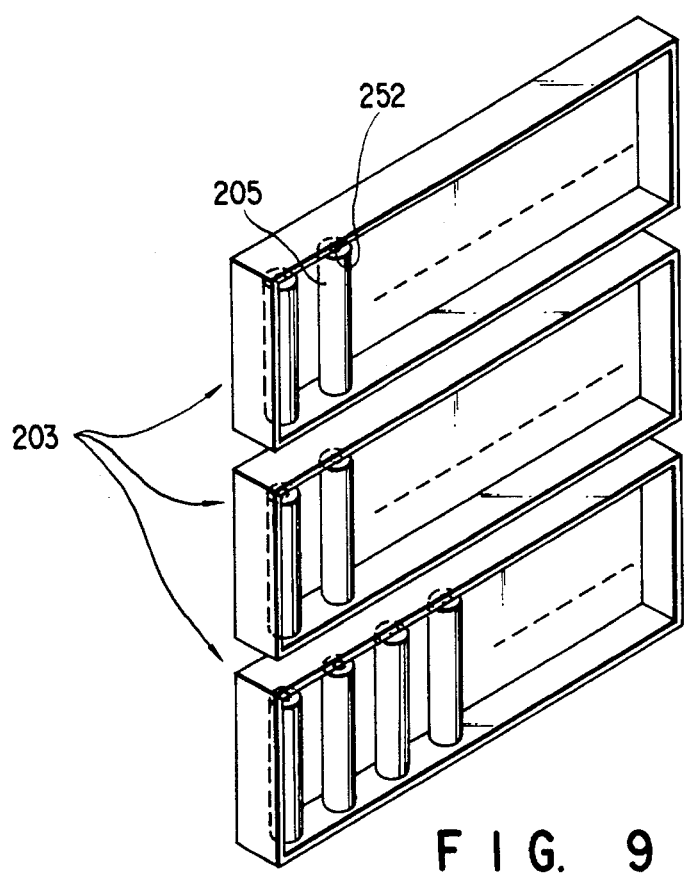
FIG. 9 is a perspective view showing a first modification of the filter unit.
Figure 10:
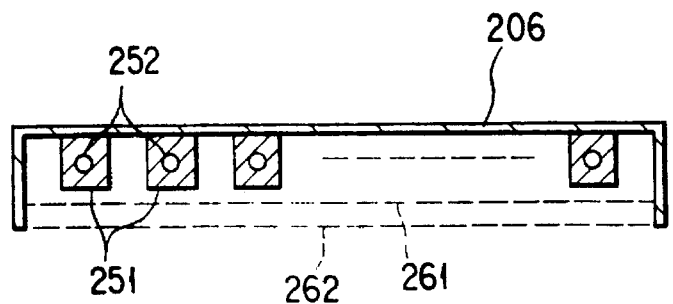
FIG. 10 is a cross-sectional view showing a second modification of the filter unit.

In the second embodiment, a single filter unit 203 is situated along the side wall of the transfer chamber 223. However, as shown in FIG. 9, the cylindrical filters 205 may be shortened and, for example, three filter units 203 may be vertically arranged. The cross-sectional shape of each cylindrical filter 205 may not be circular, but may be polygonal or oval. Furthermore, the filter unit 203 may be fixed, as shown in FIG. 10, such that the air-stream restriction panel 206 is put in contact with the rear faces of rectangular filters 251.

Those regions of the air-stream restriction panel 206, which surround the cylindrical filters 205, may have polygonal, and not arcuated, cross sections. Alternatively, the restriction panel 206 may be flat without partitioning the adjacent cylindrical filters 205, as shown in FIG. 10. In addition, the number of air-stream restriction plates 261 may be one or three or more. As is shown in FIG. 10, a gap between the air-stream restriction plates 261 and 262 may be increased to define a buffer chamber. The air feed hole 252 of each cylindrical filter 205 may have an opening at a middle portion thereof along the longitudinal axis and may have both end portions closed. The cylindrical filters 205 may be arranged in parallel or in a radial fashion. The air stream may not be circulated, and the pump may be replaced by a blower as pressure-feed means.

The air cleaning apparatus of the present invention is not limited to the above embodiments. This apparatus may be applied to a wafer transfer region in a normal-temperature atmosphere, e.g. a wafer transfer region in a wafer washing apparatus or a carrier stocker. This air cleaning apparatus is applicable to not only the case where an air stream is formed, but also to the case where an inert gas stream is formed. Moreover, this air cleaning apparatus is applicable to not only the wafer transfer region but also to, e.g. an LCD substrate transfer region.

Figure 11:
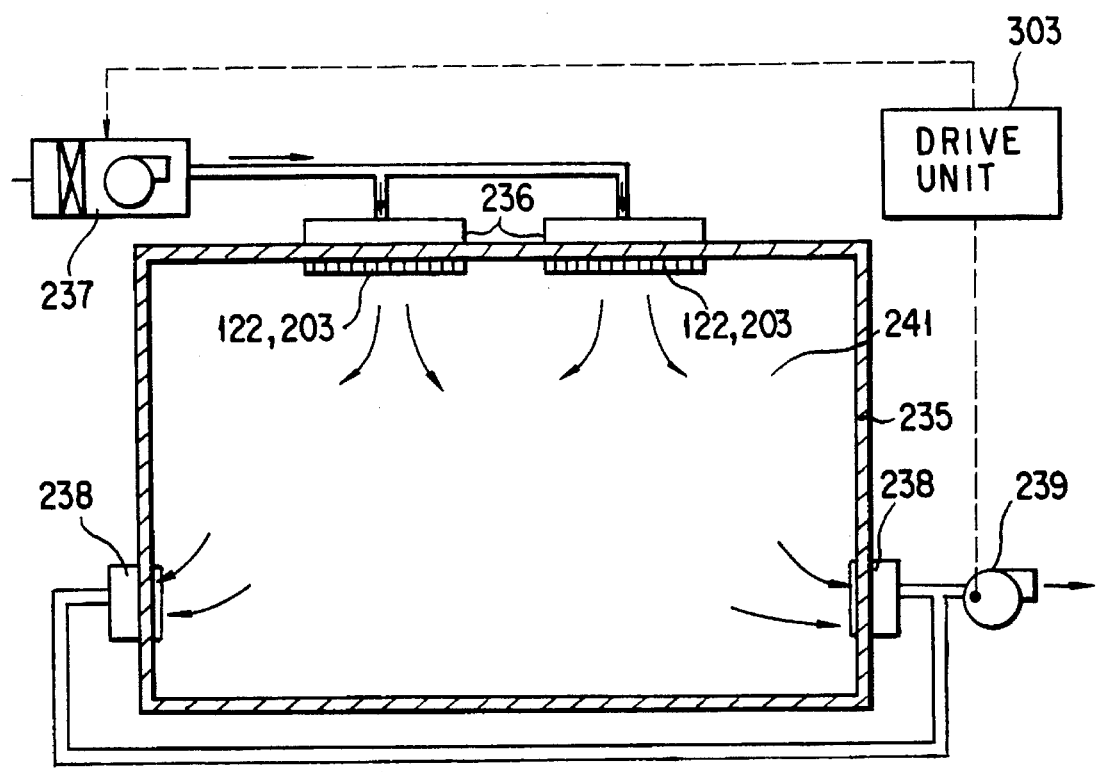
FIG. 11 is a schematic view showing an example in which the air cleaning apparatus of the present invention is situated between the processing unit and the clean room.

FIG. 11 shows an embodiment wherein the filters 122 (174), 203 of the above embodiments is applied to a clean room. Air blow chambers 236 are provided at a top portion of a sealed chamber 235. These air blow chambers 236 are connected to an air feed chamber 237. Exhaust chambers 238 are provided near the bottom of the sealed chamber 235, and these exhaust chambers 238 are connected to an exhaust device 239. Dust in the air supplied from the air feed device 237 is removed by the filters 122 (174), 203 provided in the air blow chambers 236, and purified air is introduced into the sealed chamber 235. Thus, the sealed chamber 235 is used as a clean room 241.

The present invention is not limited to the above embodiments, and various modifications can be made without departing from the spirit of the invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An air cleaning apparatus comprising:

an air passage chamber having a suction port, from which air is sucked, and a discharge port from which the air sucked from the suction port is discharged;

air blow means, provided in said air passage chamber, for sucking the air from said suction port into the air passage chamber and discharging the sucked air from said discharge port; and particle removing means for removing particles contained in the air sucked from the suction port, the entire body of said particle removing means being formed of a material which generates little impurity gas detrimental to processing in a processing space;

wherein said particle removing means comprise:

a filter unit constituted by a plurality of cylindrical filters each having an axially extending air feed hole in a cylindrical filtering material, said air feed hole having one end opened and the other end closed in the cylindrical filter, and an air stream restriction member disposed about at least a portion of an outer periphery of each of said cylindrical filters for restricting an air stream output about the portion of the outer periphery of each of said cylindrical filters to cause the air stream to flow to a front side of each of said cylindrical filters, and wherein said cylindrical filters are partitioned by said air stream restriction member on their lateral sides, said cylindrical filter and said air stream restriction member being formed of one selected from the group consisting of a metallic material, a ceramic material and a resin material; and guide means for guiding a gas in said air passage chamber fed from said air blow means towards the opened end of the air feed hole of each of the cylindrical filters.

2. The air cleaning apparatus according to claim 1, wherein said particle removing means further comprises a filter frame and an air filter fixed to the filter frame, said filter frame and said air filter being formed of one selected from the group consisting of a metallic material, a ceramic material and a resin material.

3. The air cleaning apparatus according to claim 2, wherein said air filter is soldered to the filter frame.

4. The air cleaning apparatus according to claim 2, wherein said air filter is formed in a corrugated sheet shape.

5. The air cleaning apparatus according to claim 1, wherein said filter unit comprises a plurality of filter unit components arranged vertically.

6. The air cleaning apparatus according to claim 1, further comprising at least one laminar flow forming means, provided at the discharge port of said air passage chamber, for discharging clean air, from which particles have been removed by said particle removing means, in the form of laminar flows.

7. The air cleaning apparatus according to claim 1, further comprising an activated carbon filter, provided on the upstream side of said particle removing means, for removing an impurity gas contained in the air sucked into said air passage chamber.

8. An air cleaning apparatus comprising:

a plurality of cylindrical filters each having an axially extending air feed hole in a cylindrical filtering material, said air feed hole having one end opened and the other end closed in the cylindrical filter, said cylindrical filter being formed of one selected from the group consisting of a metallic material, a ceramic material and a resin material;

an air stream restriction member disposed about at least a portion of an outer periphery of each of said cylindrical filters for restricting an air stream output about the portion of the outer periphery of each of said cylindrical filters to cause the air stream to flow to a front side of each of said cylindrical filters, and wherein said cylindrical filters are partitioned by said air stream restriction member on their lateral sides, said air stream restriction member being formed of one selected from the group consisting of a metallic material, a ceramic material and a resin material; and pressure-feed means for feeding pressurized air to the opened end of the air feed hole of said cylindrical filter.

9. An air cleaning filter comprising:

a filter frame formed of a metallic material; and a filter portion, said filter portion including a plurality of cylindrical filters, and an air stream restriction member, said air stream restriction member partially disposed between adjacent cylindrical filters such that said cylindrical filters are partitioned by said air stream restriction member on their lateral sides.

10. The air cleaning filter according to claim 9, wherein each of said plurality of cylindrical filters includes an axially extending air feed hole in a cylindrical filtering material, said air feed hole having one end opened and the other end closed, and wherein said air stream restriction member extends about at least a portion of an outer periphery of each of said cylindrical filters for restricting an air stream about the portion of the outer periphery of each of said cylindrical filters, to cause the air stream to flow to a front side of each of said cylindrical filters.

11. A processing apparatus comprising:

a processing unit in which an object is processed;

a housing for housing said processing unit; and at least one air cleaning apparatus, situated within said housing, for forming an air circulation flow within said housing and removing particles in the air circulation flow, wherein said air cleaning apparatus comprises:

an air passage chamber having a suction port, from which the air in said housing is sucked, and a discharge port from which the air sucked from the suction port is discharged into said housing;

air blow means, provided in said air passage chamber, for sucking the air from said suction port into the air passage chamber and discharging the sucked air from said discharge port; and particle removing means for removing particles contained in the air sucked from the suction port, the entire body of said particle removing means being formed of a material which generates little impurity gas detrimental to processing in a processing space, said particle removing means including a plurality of cylindrical filters, and an air stream restriction member, said air stream restriction member partially disposed between adjacent cylindrical filters such that said cylindrical filters are partitioned by said air stream restriction member on their lateral sides.

12. The processing apparatus according to claim 11, wherein said air passage chamber is provided with exhaust means for exhausting part of the air sucked in the air passage chamber to the outside of the housing.

13. The processing apparatus according to claim 11, wherein each of said plurality of cylindrical filters includes an axially extending air feed hole in a cylindrical filtering material, said air feed hole having one end opened and the other end closed, and wherein said air stream restriction member extends about at least a portion of an outer periphery of each of said cylindrical filters for restricting an air stream about the portion of the outer periphery of each of said cylindrical filters, to cause the air stream to flow to a front side of each of said cylindrical filters.

14. A processing apparatus comprising:

a processing unit in which an object is processed;

a housing for housing said processing unit; and an air cleaning apparatus, attached to said housing, for purifying air sucked from the outside of the housing and discharging the purified air into the housing, wherein said air cleaning apparatus comprises:

an air passage chamber having a suction port, through which the air outside the housing is sucked, and a discharge port from which the air sucked through the suction port is discharged into said housing;

air blow means, provided in said air passage chamber, for sucking the air from said suction port into the air passage chamber and discharging the sucked air from said discharge port; and particle removing means for removing particles contained in the air sucked from the suction port, the entire body of said particle removing means being formed of a material which generates little impurity gas detrimental to processing in a processing space, said particle removing means including a plurality of cylindrical filters, and an air stream restriction member, said air stream restriction member partially disposed between adjacent cylindrical filters such that said cylindrical filters are partitioned by said air stream restriction member on their lateral sides.

15. The processing apparatus according to claim 14, wherein each of said plurality of cylindrical filters includes an axially extending air feed hole in a cylindrical filtering material, said air feed hole having one end opened and the other end closed, and wherein said air stream restriction member extends about at least a portion of an outer periphery of each of said cylindrical filters for restricting an air stream about the portion of the outer periphery of each of said cylindrical filters, to cause the air stream to flow to a front side of each of said cylindrical filters.

* * * * *